United States Patent [19]

Klostermeier et al.

[11] Patent Number: 4,522,880
[45] Date of Patent: Jun. 11, 1985

[54] THICK POLYIMIDE-METAL LAMINATES WITH HIGH PEEL STRENGTH

[75] Inventors: Werner Klostermeier, Klingenberg, Fed. Rep. of Germany; Jeffery D. Lasher, Tolland, Conn.; Gerhard Meyer, Obernburg; Hans Zengel, Kleinwallstadt, both of Fed. Rep. of Germany

[73] Assignee: Akzona Incorporated, Enka, N.C.

[21] Appl. No.: 534,223

[22] Filed: Sep. 21, 1983

[30] Foreign Application Priority Data

Jan. 15, 1983 [DE] Fed. Rep. of Germany ....... 3301197

[51] Int. Cl.³ .................... B32B 15/08; B32B 27/08; B28B 3/20; B05D 3/02
[52] U.S. Cl. ................ 428/332; 156/244.11; 156/244.24; 264/176 R; 264/205; 427/385.5; 427/388.1; 427/393.5; 428/334; 428/335; 428/336; 428/394; 428/458; 428/473.5
[58] Field of Search ............... 528/501, 351; 428/473.5, 458, 332, 334, 335, 336, 394; 264/176 R, 205; 427/385.5, 388.1, 393.5; 156/244.11, 244.24

[56] References Cited

U.S. PATENT DOCUMENTS

| 3,168,417 | 2/1965 | Smith, Jr. et al. | |
|---|---|---|---|
| 3,428,602 | 2/1969 | Haller | 528/501 |
| 3,471,276 | 10/1969 | Bragaw | 51/293 |
| 3,981,847 | 9/1976 | Meyer et al. | 528/351 |
| 4,411,952 | 10/1983 | Sasaki et al. | 428/473.5 X |

FOREIGN PATENT DOCUMENTS

| 705977 | 4/1968 | Belgium | 51/293 |
|---|---|---|---|
| 1198856 | 7/1970 | United Kingdom | 428/473.5 |

Primary Examiner—Thomas J. Herbert
Attorney, Agent, or Firm—Jack H. Hall; David M. Carter; Francis W. Young

[57] ABSTRACT

A laminate comprising an insoluble, intractable relatively thick layer of a polyimide bonded tightly onto a metallic substrate without the necessity for an intermediate adhesive bonding layer and a process for preparing such by directly extruding a polyamic acid polyimide-precursor onto said substrate and converting said polyamic acid to the polyimide in a single pass in at least two heating stages.

18 Claims, 2 Drawing Figures

THICK POLYIMIDE-METAL LAMINATES WITH HIGH PEEL STRENGTH

BACKGROUND

The present invention is concerned with a flexible laminate consisting of an intractable, i.e., no longer moldable, layer of a fully aromatic polyimide and a substrate and a method for forming a polyimide layer directly on a substrate, e.g., copper foil or wire, to form a laminate in which the layers are tightly adhered without an adhesive layer intermediate the polyimide layer and the supporting substrate layer. The polyimides of the present invention are obtained from polyamide acids by an extrusion and curing process which takes place in situ by a process not heretofore known.

The preparation of polyamidocarboxylic acids, commonly referred to as polyamide acids or polyamic acids, which are the precursors or intermediate compounds in the preparation of polyimides, is well known and reference may be made to, e.g. Meyer et al. U.S. Pat. No. 3,981,847 and Sroog et al., J. POLY. SCI., Part A, Volume III, pages 1373–1390 (1965), among others. As is well known, the polyamic acids may be cured to extremely heat-resistant, highly insulating polyimides by a cyclization reaction under the influence of heat or dehydrating agents. Because of the intractability of polyimides with high thermal stability, they must be formed into the desired shape of the end product in the form of the polyamic acid and then or subsequently subjected to cyclization reaction conditions.

The preparation of the polyamic acids is likewise well known, e.g., by the reaction of a tetracarboxylic dianhydride with a primary diamine at temperatures below about 80° C. in an anhydrous, polar, aprotic organic solvent such as those disclosed in the aforementioned U.S. Pat. No. 3,981,847. Also disclosed therein are many of the aromatic dicarboxylic acids, dicarboxylic dianhydrides and aromatic diamines useful in the present invention, which are incorporated herein by reference.

Edwards U.S. Pat. Nos. 3,179,614 and 3,179,634 describe, respectively, methods of preparation of polyamic acids and conversions thereof to the polyimides. These prior patents disclose several methods of coating substrates with polyamic acids and subsequently curing them to polyimide films, for example, by spray gun or dipping techniques followed by air drying at room temperature for several days and then subsequently curing for 30 minutes at 300° C. By these methods, films of up to about 25 µm thickness were prepared, but films or coatings having greater thicknesses required multiple coating and conversion cycles. The drawback observed with multiple coatings onto planar substrates (as opposed to wire) is that adhesion between layers of polyimide coats is extremely low and, therefore, the layers tend to delaminate readily. Polyimide films were also made by casting polyamic acid onto glass plates, drying under vacuum at 50°–80° C. and converting the polyamic acid films to the corresponding polyimides by heating to 300° C. for 30 minutes. The aromatic polyimides disclosed therein are all useful in said invention and said patents are incorporated herein by reference.

European Pat. No. 36,330 describes a process for continuously producing an aromatic polymide film that is soluble in a phenolic-type solvent, e.g., phenol itself or monohalogenated phenol or cresol. On the other hand, the present invention relates to a continuous process for making and shaping a phenol-insoluble, intractable polyimide. While the patent sets forth the desirability of providing a continuous process for the production of polyimides and the extrusion onto a substrate, the disclosed process does not relate to the intractable polyimides of the present invention.

Published European Application No. 48,221 purports to relate to flexible foil substrates provided with a film of polyamide, polyamide-imide or polyimide adhered thereto without an intermediate adhesive layer. However, the only data on actual results relates to the preparation of aromatic polyamides which are soluble and coated in their final, polymerized, form from a solution. No further curing after the film is coated is required. The adhesion of the polyamide film to the substrate is said to be excellent. However, this teaching has no application to polyimides of the present invention, which are insoluble; the insoluble polyimides must be coated on the substrate in the form of their soluble precursor and polymerized in situ.

As to the insoluble polyimides, no specific teaching of conditions required to cure polyamic acids to polyimides in situ is found in European Application No. 48,221, leaving one to consult other references for such conditions. And, of course, the adhesion of the films will be no greater than that obtained by the known prior art, since there is no discussion or disclosure of any modification of conventional processes to increase the adhesion of the polyimides mentioned. One can refer, e.g. to the '614 patent, supra, and, in particular, Example 26, which only states that "good adhesion" is observed on copper, aluminum, steel and glass. However, it has been found that peel strengths of less than 1.7 N/cm are realized.

Notwithstanding the statements just mentioned in European Patent Application No. 48,221 heretofore, it has not been possible to obtain a polyimide (PI) layer of sufficient thickness, i.e., greater than about 25 µm, by a continuous extrusion process permitting a direct application onto a final substrate, e.g., copper foil to obtain a laminate having the required peel strength and necessary electrical properties, e.g., dielectric dissipation factor, dielectric strength, volume resistivity and insulation resistance sufficient to satisfy commercial requirements for flexible printed circuits utilizing such laminates. With the intractable types of polyimides of the present invention, it has been a commercial practice to form unsupported films of the polyamic acid precursor, cure the film and subsequently laminate the polyimide film to a copper substrate with an intermediate adhesive layer, or coat the unsupported polyimide film with a layer of copper, e.g., by vapor deposition. This process, of course, requires an extra step plus the adhesive material used in the laminating process. Moreover, the laminate suffers the technical drawback that available adhesives will not withstand the same high temperatures that the polyimide film can and therefore applications requiring such higher temperatures have been precluded, where, for example, soldering or welding of connections is required. At temperatures reached in the laminate during the soldering, the adhesive softens or melts and the polyimide film "swims" or "floats" in the melted adhesive on the copper surface.

A more desirable process, which would avoid the aforementioned difficulties with adhesives, would be one in which a polyimide solution was extruded directly onto the ultimate supporting sheet after which the solvent thereafter would be removed so as to develop a strong bond between the polyimide film and the substrate. However, the polyimides of the present invention are not soluble in ordinary solvents capable of carrying out the polymerization of polyamic acid. Therefore, the polyimides of the present invention cannot be extruded directly onto the substrate in the same way as the phenol-soluble polyimides of the European Pat. No. 36,330, mentioned above. On the other hand, the polyimides insoluble in phenolic solvents are far superior to the soluble ones as regards theremal stability.

Polyamic acid (PAC) precursors of the aromatic polyimides are soluble, but in previous attempts to coat the polyamic acid onto the substrate and cure the polyamic acid to a polyimide, blisters and bubbles formed, due to a combination of rapid volatilization of the solvent and evolution of water formed by the imidization reaction in the interior of the coating and the formation of a skin of polyimide trapping solvent and water as voids within the film matrix. The discontinuities thereby created in the polyimide layer disrupt the electrical properties required for printed circuit applications of the polyimide laminates, lower the mechanical properties, e.g., tensile strength, elongation to break, etc. of the film and also reduce the strength of the bond between the polyimide film and substrate. A surface layer of polyimide or skin may be formed due to premature curing at the surface layer of PAC and can prevent the release of volatiles (solvent or moisture) by diffusion to the surface, leading to agglomeration of volatile molecules and the formation of voids within the polyimide layer. We have found we can prevent this "skin effect" by programming the temperature of cure so that no PI skin is formed until substantially all of the solvent and volatile products have been diffused to the free surface of the PI layer and released from the surface of the film. Trying to cure thick films prior to substantially complete removal of the solvent leads to the formation of brittle, discontinuous low molecular-weight polyimide film.

U.S. Pat. No. 3,428,602 to Haller addresses the problem of blowing and blistering which is encountered in casting thicker sections of polyimide materials cast as films onto a polytetrafluorloethylene carrier film. Haller suggests that the solvent must be removed from the polyamic acid solution while maintaining the temperature below the heat curing temperature of the polyamide acid because simultaneous removal of the solvent and conversion of the acid to the polyimide causes the blowing and blistering. Moreover, Haller found that after the solvent is reduced to about 50%, merely continuing the heat drying process is ineffectual in lowering the solvent content further. In accordance with the teaching of Haller, after a low solids polyamide acid solution of 12–15% (by volume) is cast into a thin film and heat dried at temperatures below the heat curing temperature of the polyamide acid to lower the solvent content to about 50%, the concentrated polyamide acid solution is then subjected to a shearing operation, for example, in a rubber mill, with further heat drying at temperatures from about 65° C. up to about 149° C. to concentrate the polyamide acid to 75%. The concentrated polyamide acid is then shaped, e.g., by passing it through nip rolls to form a thick sheet which is heated in a curing oven at temperatures ranging from about 149° C. to about 371° C. Haller found it necessary to subject the polyamide acid to the shearing action of a rubber mill to attain sufficient surface exposure to provide the additional drying of the acid solution prior to curing. Furthermore, Haller relates to the formation of free film with greater than 250 $\mu m$ thickness, but does not relate to the direct extrusion onto a substrate which will adhere thereto with the necessary strength for finished products without the need for an adhesive layer.

German Pat. No. 1,202,981 granted Oct. 14, 1965 discloses a method for preparing shaped polyimide articles by gradually raising the temperature during conversion of the polyamide acid into the polyimide. For example, in Example 16 a pigmented polyamide acid is coated onto a copper substrate and converted by heating into an insoluble polyimide by introducing the film into an oven at 100° C. and raising the temperature to gradually over 35 minutes to 370° C. The films were said to exhibit good adhesion properties, however, the peel strength in those films has been found to be less than 1.7 N/cm. Also, a bubble-free film having a thickness of greater than about $10\mu$ cannot be obtained unless the temperature is increased in a certain manner as discovered by Applicants herein and is carefully controlled in the respective temperature zones. For example, as seen in Example 17 of the German patent, ten separate layers are required to obtain a thickness of the coating of 0.023 mm or 0.0023 mm per layer on an AWG #25 wire.

It is an object of the invention to produce a flexible, polyimide laminate without using an adhesive layer, but one which will adhere to the substrate layer with peel strength equivalent to adhesive-laminates and at a cost far below that of conventional adhesive-joined laminates.

Another object of the invention is to produce a polyimide film laminated to a metallic substrate, such as copper, steel, aluminum, zinc, etc., without an adhesive, by directly extruding a polyamic acid onto a copper sheet or foil or the like and curing the laminate thus formed, in situ; the laminate is smooth and free of defects caused by blistering and bubbles probably due, in prior attempts, to a too rapid volatization of either solvent from the free surface of the polyamic acid coating during the curing process or water vapor produced by the imidization reaction or both.

Another object is to achieve, with a single, direct extrusion process, a PI-Cu laminate with a polyimide layer at least 10 $\mu m$ (0.4 mils) thick, having a peel strength of at least 4 N/cm. (N=Newton), a dissipation factor of $1.5 \times 10^{-3}$ to $5 \times 10^{-3}$ at 1 Khz and a dielectric strength of at least about 2 KV/mil.

A further object is to achieve a polyimide laminate with high peel strengths able to withstand high temperatures used in processing such laminates into useful products, such as temperatures reached in soldering connectors to printed circuit boards made from said laminates, without the necessity for pre-drying to remove water from the polyimide layer or trapped in the adhesive layer.

A further object is to produce a wire coated with a single polyimide layer greater than about 64 $\mu m$ ($2\frac{1}{2}$ mils) and a process for coating in a single pass and curing in situ.

SUMMARY OF THE INVENTION

The objects of the invention are achieved by forming a polyamic acid (PAC) (polyimide precursor) by the reaction of an aromatic tetracarboxylic acid, e.g., pyromellitic acid or its dianhydride, pyromellitic dianhydride (PMDA) and an aromatic diamine, e.g. oxydianiline (4,4' diaminodiphenylether) (ODA) in a aprotic polar organic solvent, e.g. dimethylacetamide (DMAc), extruding a polyamic acid film onto a substrate, for instance, a copper foil or wire or a polymeric film or sheet, and curing the film with a thermal treatment in at least two stages to form a laminate having a polyimide layer tightly adhered to said substrate without the need for an intermediate adhesive layer to bind the polyimide film to the substrate.

The objects of the invention are further achieved by means of a laminate, which is characterized by the fact that the polyimide layer adheres directly to the carrier material with a peeling resistance of at least 4 N/cm, the polyimide being insoluble in phenolic solvents, while the polyimide layer exhibits a tensile strength of 100 to 150 N per mm$^2$, an elongation to break of 15 to 100%, and a dissipation factor of $1.5 \times 10^{-3}$ to $5 \times 10^{-3}$ at 1 KHz. Preferably, the layer thickness of the polyimide layer is 10 μm to 1 mm. In an additional preferred version, the thickness of the polyimide layer is 50 to 250 μm, and, when the carrier material consists of fibers, metal wires or cables, preference is given to a thickness from 30 to 250 μm.

The laminate of the invention can be planar, that is, a flexible layer of polyimide adhered to a sheet of copper or other metal such as aluminum, nickel or steel or a continuous or finite length coating on a rod, e.g., wire, or a tubular substrate. In any case, the polyimide layer is attached firmly to the substrate and, in the case of the planar laminate, has a high peel strength in excess of 4.0 N/cm and, preferably, greater than 5.0 N/cm.

In general, the process of the invention includes the mixing of an aromatic diamine with an aromatic tetracarboxylic acid or the dianhydride thereof under conditions to form a polyamic acid in solution in a solvent and extruding a thick layer of the polyamic acid solution directly onto the substrate, where the solvent is partially removed from the polyamic acid layer in a first heating zone, then additional solvent is removed and the polyamic acid layer is partially cured in situ in a second heating zone at a higher temperature. The polyamic acid layer is then completely cured by a further heat treatment in at least a third zone at a higher imidization-reaction-completing temperature. It is believed that to obtain a thick layer of polyimide, i.e. greater than about 10 μm, which is continuous and without defects from bubbles caused by a combination of "skin effect" and too rapid evaporation of either the solvent or the water vapor formed in the imidization, or curing step, which will adhere strongly to the substrate, a specific sequence of heat treatments is essential.

DETAILED DESCRIPTION OF THE INVENTION

Figures 1, 2:
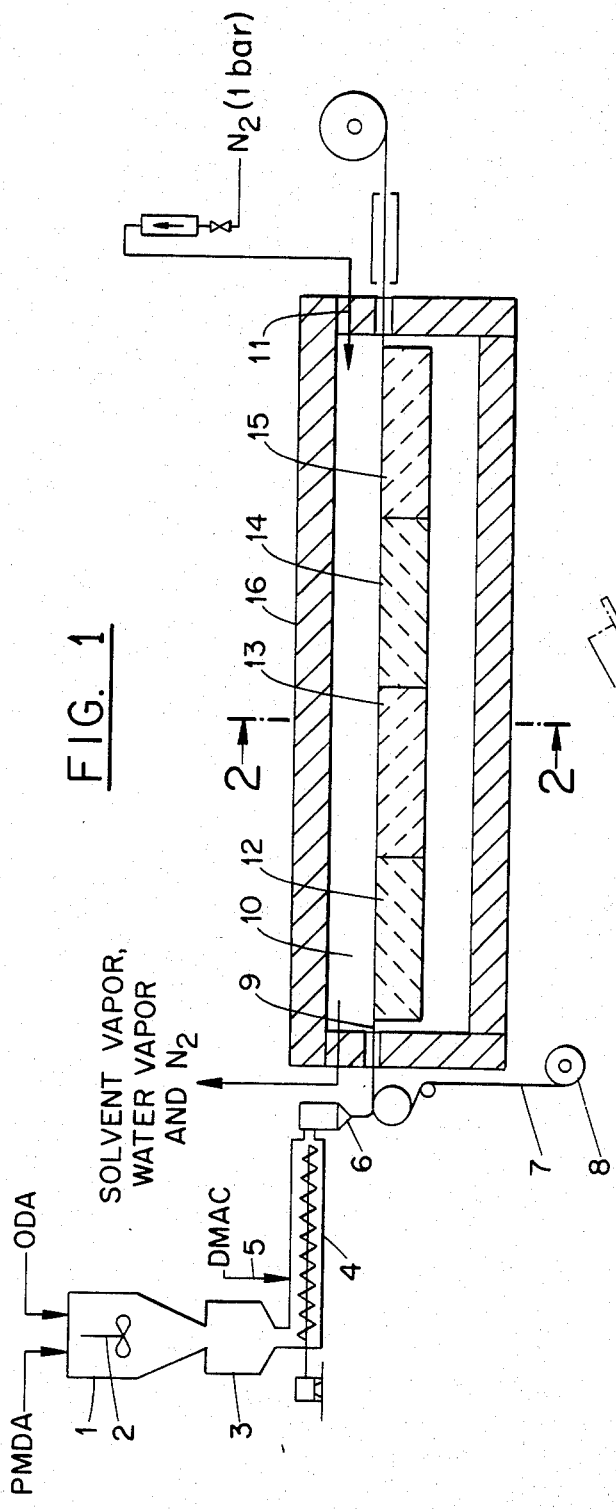
FIG. 1 illustrates the preferred apparatus shown schematically for practicing the process of the invention.
FIG. 2 is a cross-sectional view of the curing oven taken along line 2—2.

The polyamic acid (PAC) precursors of the invention, formed by the reaction of an aromatic dianhydride and an aromatic diamine in a polar organic solvent, have the following structural formula:

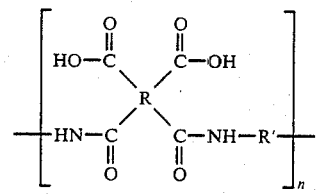

where
R is an aromatic tetravalent radical,
R' is a divalent aromatic radical and
n is sufficient to give a polyamic acid with a $\eta_{red}$ of 0.5 or greater in DMAc containing 0.1 mole/liter lithium bromide.

The PAC, after extrusion onto the substrate, is cured by the heating process disclosed herein to form an intractable, insoluble polyimide having the following repeating structure;

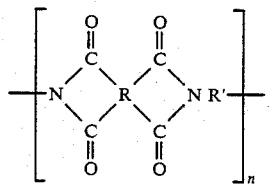

wherein R and R' are the same as above.

By "no longer moldable" within the meaning of the invention it is understood that these polyimides, in contrast to other known polyimides, cannot be melted without decomposition and are insoluble in conventional solvents so that they cannot be given a new shape by either dissolving for melting.

The preferred starting materials for the preparation of the polyamic acid are pyromellitic dianhydride and oxydianiline and the preferred solvent is dimethylacetamide.

Other reactants which form intractable polyimides insoluble in conventional solvents, e.g., phenol or substituted phenols (halogenated phenols), can also be extruded by the process of the invention. Among the aromatic dianhydrides within the scope of this invention are pyromellitic dianhydride (PMDA); 2,3,6,7-naphthalene tetracarboxylic dianhydride; 1,2,5,6-naphthalene tetracarboxylic dianhydride; bis (3,4-dicarboxyphenyl) sulfone dianhydride; perylene 3,4,9,10-tetracarboxylic acid dianhydride; bis (3,4-dicarboxyphenyl) ether dianhydride.

Among the aromatic diamines useful in this invention are 4,4'-diaminodiphenyl ether; 5-amino-2-(p-aminophenyl)benzothiazole; 4-amino-2-(p-aminophenyl)benzothiazole; 5-amino-2-(m-aminophenyl)benzothiazole; 5-amino-2-(p-aminophenyl)benzoxazole; 4-amino-2-(m-aminophenyl)benzothiazole; p- and m-phenylene diamine; 4,4'-diaminobiphenyl; bis-(4-amino phenyl)methane; 4-amino-2-(p-aminophenyl)benzoxazole; 5-amino-2-(m-aminophenyl)benzoxazole; 4-amino-2-(m-aminophenyl benzoxazole; 2,5-diamino benzoxazole; 2,5-diamino benzothiazole; etc.

Although the preferred solvent is dimethylacetamide (DMAc), other polar organic solvents such as N,N-dimethylmethoxy acetamide, dimethylformamide (DMF), diethyl formamide, N-methyl-2-pyrrolidone (NMP), and dimethylsulfoxide (DMSO) may be used.

Still others may be used, e.g., N-methyl caprolactam, dimethyl sulfone, pyridine, hexamethyl phosphoramide, N-acetyl-2-pyrrolidone, tetramethyl urea and tetramethylenesulfone.

The preparation of the polyamic acid may be performed in accordance with prior art teachings, e.g., the above-mentioned '614 and '634 patents. However, the preferred process will now be discussed in further detail and will be illustrated by reference to the drawings. In FIG. 1, a dry mixture of the dianhydride and diamine is prepared in a molar ratio between 0.95 and 1.05 PMDA:ODA. The mixture is loaded into a gravimetric metering feeder 3. The mixture is then fed to an extruder-reactor 4 at a precisely controlled rate. A polar solvent is added to the dry mixture in the extruder reactor 4 through a metering pump at 5. The molar ratio of dianhydride to diamine controls the molecular weight of the polyamic acid solution. The optimal range of molecular weight of the polyamic acid is obtained with a molar ratio between 0.98 and 1.02, and is measured as reduced viscosity ($\eta_{red}$) of a 0.5% solution in dimethyacetamide containing 0.1 moles per liter of lithium bromide. The reduced viscosity of the polyamic acid at molecular ratios between 0.95 and 1.05 is 0.5 to 4.0, and is between about 1.0 and 4.0 in the optimal ratio range of 0.98 to 1.02. At a molar weight ratio of 0.95, the average molecular weight of the PAC formed has been found to be about 32,000; at 1.0, about 200,000; at 1.03, about 35,000 (determined by an FICA light scattering photometer, Model PGD 42000 at $\lambda=436$ nm).

The temperature in the mixer-reactor 4 should be maintained below about 80° C., but in practice, the temperature may be increased gradually from about 20° C. or in zones of increasing temperature to a maximum of 80° C. The solvent is added in the first zone of extruder-reactor 4. Residence time in the extruder-reactor 4 is in the order 1 to 5 minutes. The reaction to form the polyamic acid is complete at the end of that residence time.

The polyamic acid solution having a reduced viscosity of from 0.5 to 4.0, preferably more than 1.0, and most preferably 1.2 to 2, is then extruded through a slit die 6 onto a substrate 7 which may be a sheet of copper or other metal or synthetic film pulled from a coil or roll supply 8 of the material.

The metal sheet with polyamic acid solution coated thereon next passes through a curing oven 10 blanketed with nitrogen from a supply 11 for 5–20 minutes or longer, depending on the film thickness, since longer times are required as the thickness is increased.

It has been found essential to control the temperatures in successive zones in the oven, but when that is controlled within the limits set forth herein, an intractable, bubble-free, polyimide layer is formed on the substrate 7 in a very short time, with excellent electrical and mechanical properties, which adheres to the substrate with peel strengths greater than 4.0 N/cm. While not being limited to a theoritical explanation for this surprising result, it is believed that our process requires that the solvent diffuse through the layer of polyamic acid and be released from the free film surface slowly enough so that solvent bubbles are not formed that could grow and be trapped within the polymer film matrix. More particulary, it is believed that about 30% of the solvent (as determined by TGA) must be released from the free side of the PAC film before there is substantial conversion of PAC to polyimide. During this time interval the temperature must be kept below 150° C. and preferably below about 130° C. At least about 50% more of the solvent should then be removed at a temperature below about 200° C., preferably below about 180° C., where the polyimidization reaction reaches at least about 80% complete. Also, the imidization reaction must be 80–90% completed at temperatures below about 180° C., so that the major amount of water formed by the cyclization reaction is also diffused to the surface of the film and released.

In order to accomplish the foregoing, heating zones are established in the curing oven by electrical resistance heaters 12, 13, 14 and 15 so that the drying (removal of solvent) and curing are effected in first and second stages, respectively, as follows: in the first stage, in a first zone, the temperature is maintained by electrical resistance heater 12 in the range from 100°–150° C.; the temperature in a second zone of the first stage is raised to form about 130° C. to about 200° C., preferably less than about 180° C.; in a third zone, i.e., in the first zone of the second stage, after substantially all of the solvent has diffused through the surface and removed and the major amount of water of reaction has been removed, the temperature is raised to from about 200° to 400° C.; in a fourth zone, the temperature is again raised to from about 300°–600° C. Each of the zones is approximately the same length and therefore residence time in each zone is equal, but greater laminate speeds and, hence, throughput may be achieved by lengthening any of the heating zones or by adding one or more additional heating zones to either of the stages. In the apparatus shown in FIG. 2, the oven 10 may be constructed with a lid 16, hinged for easy access to the laminate in the oven.

Specific examples of preferred forms of the invention are now set forth in detail. They are intended to illustrate, but not limit the invention.

EXAMPLE 1

A dry mixture of pyromellitic dianhydride (PMDA) and oxydianiline (ODA) was prepared in a commercial powder mixer. Altogether approximately 5.0 kg PMDA+4.54 kg ODA (PMDA:ODA=1.01) were weighed into the mixer and subsequently mixed for 48 hours at the maximum mixer speed. About 1.6 kg of the mixture was then discharged from the mixer into a gravimetric feeder which fed the mixture to a negative-feed, double-screw extruder at a rate of about 200 gm/hr. In the first zone of the extruder, maintained at 20° C., DMAc is added at a rate of about 430 gm/hr. to give a solids concentration of 31.7% by weight. During the remainder of the residence time in the extruder, the temperature is increased in succeeding zones to a maximum temperature of 50° C. A polyamide acid having a reduced viscosity ($\eta_{red}$) of 1.67 was formed and extruded from the extruder barrel through a thin film die. The die orifice had a rectangular cross section with dimensions of 200 mm×0.35 mm. The pressure at the die head was 85 bar. The polyamic acid was extruded onto a 1 oz. (thickness=35 $\mu$m) continuous sheet of rolled annealed copper foil (Oak F-111) and the laminate was fed into an oven having four temperature zones of equal length at temperatures of 140° C., 180° C., 350° C. and 400° C., respectively under a nitrogen atmosphere. The total residence time of the laminate was 10 minutes during which the PAC was substantially fully converted to the polyimide (PI). The PI film was strongly adhered to the copper substrate and was free of bubbles and discontinuities.

EXAMPLE 2

Another 1.6 kg sample of the mixture was reacted in the same manner as in Example 1 and the steps repeated except that now a copper foil (Oak F-111) of 70 μm was used as the substrate. The polyimide film was strongly adhered to the copper foil and was free of bubbles and discontinuities. The properties of the film of Examples 1 and 2 are set forth in the following table:

TABLE 1

| Property (Polyimide layer) | Ex. 1 | Ex. 2 | Test |
| --- | --- | --- | --- |
| Dielectric Strength, KV/mil @ 60 Hz | 4.4 | 4.35 | ASTM D-149 |
| Dielectric Constant 1 KHz @ 25° C. | 4.0 | 3.9 | ASTM D-150 |
| Dielectric Dissipation Factor, 1 KHz @ 25° C. | .0047 | .0039 | ASTM D-150 |
| Tensile Strength, N/mm$^2$ | 105 | 110 | ASTM D882 |
| Elongation, % | 45 | 31 | ASTM D882 |
| Density, g/cc | 1.42 | 1.42 | ASTM D1505 |
| Thickness, μm | 66 | 61 | ASTM D374 |
| LOI | 40 | | ASTM D2863 |
| Property (laminate) | | | |
| Peel strength, N/cm | 8.2 | 4.8 | IPC TM 650 2.4.9 |
| Solder Immersion (unconditioned samples) | no blisters no delaminations | no blisters no delaminations | IPC TM 650 2.4.13 (slightly modified) |

EXAMPLE 3

A 3-necked flask was charged with 8.17 g PMDA to which was added 7.58 g ODA (molar ratio PMDA:ODA=0.99:1.00) dissolved in 60 g DMAc while stirring continuously at full speed. An additional 29.25 g DMAc, which was used to wash the ODA flask, was added to the reaction flask. The reaction was continued with stirring for 80 minutes at a temperature of 22° C. under a nitrogen atmosphere. A portion of the resulting PAC solution was cast onto a 23 μm nickel-chromium foil (Inconel from Somers) which had previously been etched with a ferric chloride solution containing 30 g FeCl$_3$, 60 cc 12N HCl and 180 cc water. The cast PAC was drawn down to a thickness of 356μm by a glass rod wound with 356 μm diameter copper wire. The alloy foil was mounted on a glass plate and held with tape. The film was dried at 70° C. for 20 minutes and then placed in a vacuum oven under a vacuum of 30 in. Hg at 60° C. under nitrogen. The temperature of the oven was then raised to 310° C. during a period of 4½ hours. By the time the temperature of the film reaches 160° C., within about 1-2 minutes, most of the solvent has been driven off, as determined by observing the color of the film, a clear, light yellow. The cured dry film had a thickness of 25 μm.

A sample of PAC as made in Example 1, was diluted to 22% by weight PAC and a reduced viscosity ($\eta_{red}$) of 1.22, cast and doctored to a 356 μm wet film thickness onto a 58 μm copper-nickel alloy foil (Cupro-Nickel 30 #715 from Somers Thin-Strip/Brass Group, Olin Corp. [Somers], Waterbury, Conn.) the surface of which had been brushed ("machined scubbed"). The cast film was dyed and cured in the same manner as the above sample.

Both films had extremely high peel strength, while a similar sample on a bright untreated alloy foil peeled easily (less than 0.7N/cm). Neither the etched sample nor the brushed sample could be separated without damage to the polyimide film so as to obtain a peel strength measurement. After being subject to a temperature of 260° C. for seven days, the polyimide film on the brushed foil exhibited excellent adhesion and flexibility.

Other reactants which will form polyimides from the intermediate polyamic acid, including those listed herein, as known to those skilled in the art, are deemed to fall within the scope of the invention, provided the polyimide is insoluble in phenols or other known polyimidization solvents. Thus, it is possible to laminate those polyimides directly onto a metal substrate by extruding a polyamic acid (precursor of a polyimide) and curing, or condensing, the polyamic acid in situ to an insoluble, intractable polyimide. Furthermore, these insoluble polyimides can be laminated to other substrates than those listed above.

We claim:

1. A planar, flexible laminate comprising a plenol-insoluble, intractable fully aromatic polyimide monolayer and a supporting substrate; said substrate being either metallic foil, wire or cable, sheet metal or a formed polymeric fiber, film or sheet; wherein said polyimide layer is directly adhered to said substrate with a peel strength greater than 4.0 N/cm, said polyimide being insoluble in phenolic solvents, the polyimide layer having a tensile strength of at least about 100 N/mm$^2$ and a tensile elongation of 15 to 100 percent and a dissipation factor of from $1.5 \times 10^{-3}$ to $5 \times 10^{-3}$, at 1 Khz.

2. The laminate of claim 1 wherein the thickness of said polyimide layer is from 10 μm to 1 mm.

3. The laminate of claim 1 wherein the thickness of the polyimide layer is from 50 to 250 μm.

4. The laminate of claim 1 wherein the peel strength of said laminate is greater than 5.0 N/cm.

5. The laminate of claim 1 wherein said aromatic polyimide has the following repeating structure:

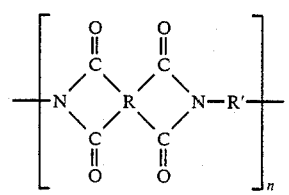

wherein
R=a tetravalent aromatic radical
R'=a divalent aromatic radical.

6. The laminate of claim 5 wherein R and 4' are

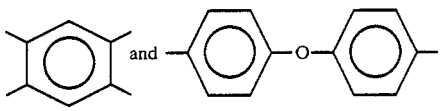 respectively.

7. A laminate comprising a polyimide layer of at least 10 μm thickness and a supporting substrate; said substrate being formed from either a metal foil, wire or cable sheet metal or a formed polymeric fiber, film or sheet; wherein said polyimide layer is directly adhered to said substrate with a peel strength of at least about 4.0 N/cm, the polyimide layer having a tensile strength of between 100 and 150 N/mm², a tensile elongation of 15 to 100 percent and a dissipation factor of from $1.5 \times 10^{-3}$ to $5 \times 10^{-3}$ at 1 Khz, said polyimide formed by heat curing a polyamic acid composition derived from the reaction of pyromellitic dianhydride (PMDA) with 4,4' oxydianiline (ODA), in the presence of a polar organic solvent, the molar ratio of PMDA to ODA being in the range of 0.95 to 1.05, said laminate being formed by extrusion, in a continuous process, of a solution of said polyamic acid containing at least 50% by weight of said solvent, without prior removal of substantial amounts of solvent, through a die onto said substrate, and gradually removing the solvent at one or more temperatures in the range of 100° C. to 200° C. and curing said film at a higher temperature to obtain said polyimide without the application of a roller on said film to remove the solvent.

8. The laminate of claims 1 or 7 wherein said substrate is a metallic foil selected from the group consisting of copper, aluminum, nickel and steel.

9. The laminate of claims 1 or 7 wherein said substrate is rolled annealed copper.

10. The laminate of claim 7 wherein said reaction takes place in said extruder.

11. The laminate of claim 7 wherein the wall thickness of the cured polyimide coating is from 30 to 250 μm.

12. The laminate of claim 7 wherein said polar organic solvent is an aprotic solvent.

13. The laminate of claim 12 wherein said aprotic, polar, organic solvent is selected from the group consisting of dimethylacetamide, dimethylformamide, N-methyl-2-pyrrolidone, and dimethylsulfoxide.

14. A process for forming shaped articles comprising a laminate including a substrate, said substrate being either a metallic foil, wire or cable, sheet metal or a formed polymeric fiber, film or sheet and a phenol-insoluble, intractable polyimide film having a thickness of at least 10 μm formed by reacting an aromatic tetracarboxylic acid or the dianhydride thereof and an aromatic diamine in the molar ratio of tetracarboxylic acid or dianhydride to diamine in the range of 0.95 to 1.05 in a polar organic solvent to form a polymeric composition consisting of a polymeric acid having the formula:

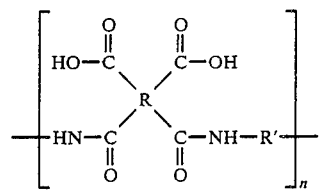

where
R is an aromatic tetravalent radical,
R' is a divalent aromatic radical and
n is sufficient to give a polyamic acid with a $\eta_{red}$ of 0.5 or greater extruding a film of said polyamic acid onto a substrate, removing the solvent from said film in a first state, the temperature of said first stage being in the range from 100° to 200° C. whereby substantially all of said solvent is removed and polyamic acid partially cured to polyimide and further curing to an insoluble, intractable polyimide thereon in a second stage, wherein the temperature of said second stage is at least 200° C., whereby at least 95% of said polyamic acid is converted to a polyimide, without the application of a roller on said film to remove said solvent.

15. A process for forming shaped articles comprising a laminate including a substrate, said substrate being either a metallic foil, wire or cable, sheet metal or a formed polymeric fiber, film or sheet and a phenol-insoluble, intractable polyimide film having a thickness greater than 10 μm formed by reacting an aromatic tetracarboxylic acid or dianhydride thereof and an aromatic diamine in the molar ratio of tetracarboxylic acid to diamine in the range of 0.95 to 1.05 to form a polymeric composition consisting of a polyamic acid having the formula, $$\left[ \begin{array}{c} \text{HO}-\overset{\overset{\displaystyle O}{\|}}{C} \diagdown \diagup \overset{\overset{\displaystyle O}{\|}}{C}-\text{OH} \\ R \\ -\text{HN}-\underset{\underset{\displaystyle O}{\|}}{C} \diagup \diagdown \underset{\underset{\displaystyle O}{\|}}{C}-\text{NH}-R'- \end{array} \right]_n$$

where
R is an organic tetravalent radical,
R' is a divalent radical and
n is sufficient to give a polyamic acid with a $\eta_{red}$ of 0.5 or greater extruding said polyamic acid onto a substrate and curing by continuously passing said substrate having said polyamic acid coating extruded thereon through at least two stages of increasing temperature to permit removal of at least about 80% of the organic solvent in a first stage and curing said polyamic acid coating at a higher temperature and for sufficient time to form the insoluble solid polyimide in a second stage without the application of a roller on said film to remove the solvent.

16. The process of claim 15 wherein said polyamic acid solution is continuously metered from a mixing-conveying device through a shaped orifice as a film.

17. The process of claim 15 wherein said film is heated in said second stage to a temperature in the range of 300° to 600° C. to form an insoluble, intractable solid polyimide film.

18. The process of claim 15 with 2 stages, wherein said 1st and 2nd zones, wherein the temperature of said 1st zone is from 100° to 150° C. and said 2nd zone is from 150° to 200° C.; and said 2nd stage has 1st and 2nd zones, wherein the temperature of said 1st zone is from 200° to 300° C. and said 2nd zone is from 300° to 500° C.

* * * * *